United States Patent
Bharat et al.

(10) Patent No.: US 10,381,404 B2
(45) Date of Patent: Aug. 13, 2019

(54) INTEGRATED CIRCUITS WITH MEMORY CELLS AND METHODS FOR PRODUCING THE SAME

(71) Applicant: Globalfoundries Singapore Pte. Ltd., Singapore (SG)

(72) Inventors: Bhushan Bharat, Singapore (SG); Juan Boon Tan, Singapore (SG); Danny Pak-Chum Shum, Singapore (SG); Yi Jiang, Singapore (SG); Wanbing Yi, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/669,994

(22) Filed: Aug. 7, 2017

(65) Prior Publication Data
US 2019/0043922 A1     Feb. 7, 2019

(51) Int. Cl.
| H01L 27/12 | (2006.01) |
| H01L 27/22 | (2006.01) |
| H01L 43/12 | (2006.01) |
| H01L 43/10 | (2006.01) |
| H01L 43/02 | (2006.01) |

(52) U.S. Cl.
CPC ........... *H01L 27/228* (2013.01); *H01L 43/12* (2013.01); *H01L 27/1203* (2013.01); *H01L 43/02* (2013.01); *H01L 43/10* (2013.01)

(58) Field of Classification Search
CPC ... H01L 7/228; H01L 27/228; H01L 27/1203; H01L 27/24; H01L 27/2436; H01L 27/01; H01L 27/12; H01L 27/115; H01L 27/088; H01L 43/12; H01L 43/02; H01L 43/10; H01L 29/76; H01L 29/788; H01L 29/94; H01L 27/22; H01L 27/108; H01L 29/66; H01L 29/74; H01L 29/66363; H01L 29/423; H01L 23/532; H01L 23/528; H01L 23/48; H01L 23/544
USPC ........................................................ 257/252
See application file for complete search history.

(56) References Cited

U.S. PATENT DOCUMENTS

| 7,956,442 | B2 | 6/2011 | Hsu et al. | |
| 8,181,688 | B2 | 5/2012 | Johnson et al. | |
| 9,188,434 | B2 | 11/2015 | Xu et al. | |
| 2002/0047157 | A1* | 4/2002 | Hidaka | H01L 27/1203 257/347 |
| 2003/0086313 | A1 | 5/2003 | Asao | |
| 2008/0048237 | A1* | 2/2008 | Iwata | G11C 16/0483 257/314 |
| 2012/0181534 | A1 | 7/2012 | Hatano | |
| 2013/0161746 | A1* | 6/2013 | Posseme | H01L 29/78696 257/347 |

(Continued)

OTHER PUBLICATIONS

Taiwanese Intellectual Property Office, Examination Report for Taiwanese Patent Application No. 106129967, dated May 15, 2018.

*Primary Examiner* — Chuong A Luu
(74) *Attorney, Agent, or Firm* — Lorenz & Kopf, LLP

(57) ABSTRACT

Integrated circuits and methods of producing the same are provided. In an exemplary embodiment, an integrated circuit includes a substrate having a buried insulator layer and an active layer overlying the buried insulator layer. A transistor overlies the buried insulator layer, and a memory cell underlies the buried insulator layer. As such, the memory cell and the transistor are on opposite sides of the buried insulator layer.

17 Claims, 9 Drawing Sheets

(56) References Cited

U.S. PATENT DOCUMENTS

2016/0027923 A1* 1/2016 Yamazaki ........... H01L 29/7869
 257/43
2016/0372517 A1* 12/2016 Nagel .................... H01L 43/12

\* cited by examiner

INTEGRATED CIRCUITS WITH MEMORY CELLS AND METHODS FOR PRODUCING THE SAME

TECHNICAL FIELD

The technical field generally relates to integrated circuits with memory cells and methods of producing the same, and more particularly relates to integrated circuits with memory cells formed in a more compact area and methods of producing the same.

BACKGROUND

Integrated circuits are becoming smaller, more compact, and more crowded as time goes by. More and more electronic components are formed and positioned within a given area so that smaller devices are possible, including smaller memory cells and interconnects used to operate the memory cells. However, as electronic components are positioned closer together, the close proximity can induce unwanted effects. An electrical current flowing through a conductor produces a magnetic field, and a fluctuating magnetic field produces an electrical current in a conductor within that fluctuating magnetic field. As such, when electronic components are positioned too close together, the magnetic field produced by one component induces a current in the next, and a phenomenon known as "cross talk" occurs. This cross talk can be between interconnects, contacts, or other components. The close proximity and reduced size can also increase resistance and capacitance, which can cause a signal delay for current flowing through a conductor. Furthermore, the power required to operate an integrated circuit can be increased as sizes become smaller, and in some cases about 50 percent of the power consumed by an integrated circuit is lost by the interconnects.

Accordingly, it is desirable to provide integrated circuits with more efficient use of the space available, and methods for producing the same. In addition, it is desirable to provide integrated circuits with relaxed design rules so interconnects and/or other components may have larger dimensions and increased separation from neighboring components without increasing the overall size of the integrated circuit, and methods of producing the same. Furthermore, other desirable features and characteristics of the present embodiment will become apparent from the subsequent detailed description and the appended claims, taken in conjunction with the accompanying drawings and this background of the invention.

BRIEF SUMMARY

Integrated circuits and methods of producing the same are provided. In an exemplary embodiment, an integrated circuit includes a substrate having a buried insulator layer and an active layer overlying the buried insulator layer. A transistor overlies the buried insulator layer, and a memory cell underlies the buried insulator layer. As such, the memory cell and the transistor are on opposite sides of the buried insulator layer.

An integrated circuit is provided in another embodiment. The integrated circuit includes a substrate with a buried insulator layer and an active layer overlying the buried insulator layer. A transistor overlies the buried insulator layer, where the transistor includes a source and a drain. A source line overlies the buried insulator layer, where the source line is in electrical communication with the source, and a bit line underlies the buried insulator layer. The bit line and the source line are on opposite sides of the buried insulator layer.

A method of producing an integrated circuit is provided in yet another embodiment. The method includes forming a transistor overlying a buried insulator layer, where the transistor includes a source, a drain, and a gate. A source line is formed overlying the buried insulator layer, where the source line is in electrical communication with the source. A first drain via contact is formed through the buried insulator layer, and a memory cell is formed underlying the buried insulator layer. The memory cell is in electrical communication with the drain through the first drain via contact.

BRIEF DESCRIPTION OF THE DRAWINGS

The present embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description. Embodiments of the present disclosure are generally directed to integrated circuits and methods for fabricating the same. The various tasks and process steps described herein may be incorporated into a more comprehensive procedure or process having additional steps or functionality not described in detail herein. In particular, various steps in the manufacture of integrated circuits are well-known and so, in the interest of brevity, many conventional steps will only be mentioned briefly herein or will be omitted entirely without providing the well-known process details. An integrated circuit formed on a silicon-on-insulator substrate includes many electronic components formed on a front side of the substrate, but memory cells are formed on a back side of the substrate, where the front and back sides are on opposite sides of a buried insulator layer. This frees up space on the front side that would otherwise be reserved for a memory bank, and allows for relaxed design rules and/or the inclusion of more electronic components within a given area.

Figure 1:
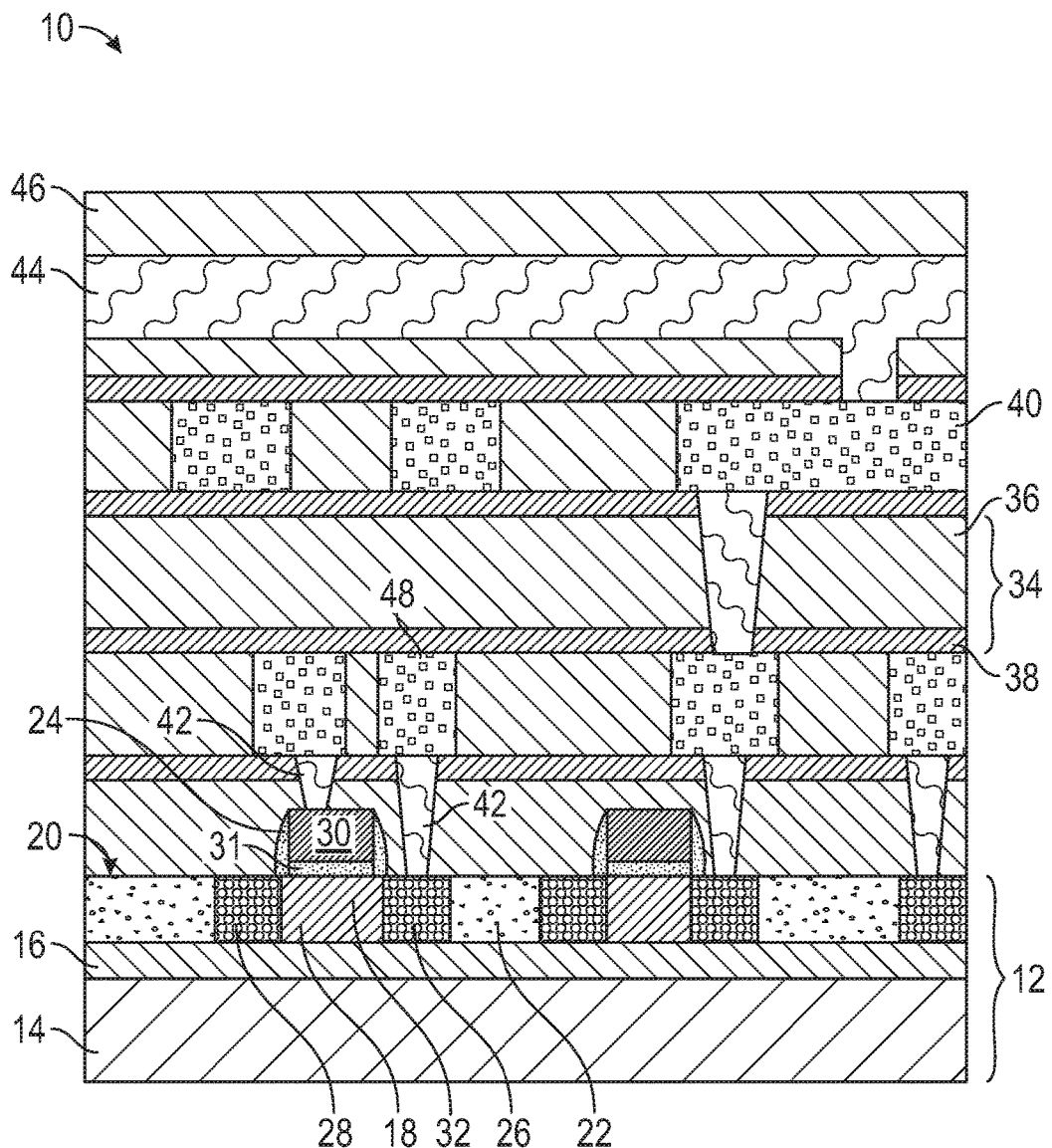
FIGS. 1-9 illustrate, in cross sectional views, an integrated circuit and methods of producing the same in accordance with exemplary embodiments.

Referring to an exemplary embodiment illustrated in FIG. 1, an integrated circuit 10 includes a substrate 12 that is a silicon on insulator (SOI) type substrate 12. The substrate includes a handle layer 14, a buried insulator layer 16 overlying the handle layer 14, and an active layer 18 overlying the buried insulator layer 16. As used herein, the term "overlying" means "over" such that an intervening layer may lie between the overlying component (the buried insulator layer 16 in this example) and the underlying component (the handle layer 14 in this example,) or "on" such that the overlying component physically contacts the underlying component. Moreover, the term "overlying" means a vertical line passing through the overlying component also passes through the underlying component, such that at least a portion of the overlying component is directly over at least a portion of the underlying component. It is understood that the integrated circuit 10 may be moved such that the relative "up" and "down" positions change, so reference to a "vertical" line means a line that is about perpendicular to a substrate surface 20, where the substrate surface 20 is the upper surface of the active layer 18. The substrate surface 20 may be used as a reference for various components described herein.

In an exemplary embodiment, the active layer 18 is formed of a semiconductor material, the buried insulator layer 16 is formed of an electrically insulating material such as silicon dioxide or other insulators, and the handle layer 14 is formed of a semiconductor material, but the handle layer 14 may be formed of other types of materials in alternate embodiments. As used herein, an "electrically insulating material" or an "electrical insulator" is a material with a resistivity of about $1 \times 10^4$ ohm meters or more, an "electrically conductive material" or an "electrical conductor" is a material with a resistivity of about $1 \times 10^{-4}$ ohm meters or less, and an "electrically semiconductive material" or an "electrical semiconductor" is a material with a resistivity of from about more than $1 \times 10^{-4}$ ohm meters to less than about $1 \times 10^4$ ohm meters. Also as used herein, the term "semiconductor material" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. As referred to herein, a material that includes a recited element/compound includes the recited element/compound in an amount of at least about 1 weight percent or more based on the total weight of the material unless otherwise indicated. In many embodiments, the active layer 18 primarily includes a monocrystalline semiconductor material.

In the illustrated embodiment, a shallow trench isolation structure 22 is formed within the active layer 18, where the shallow trench isolation structure 22 extends from the substrate surface 20 to the buried insulator layer 16. The illustrated embodiment is a fully depleted type of integrated circuit 10, but embodiments that are not fully depleted are also possible, where the shallow trench isolation structure 22 may extend into the active layer 18 but stop before reaching the buried insulator layer 16. The shallow trench isolation structure 22 is an electrical insulator, and may include silicon dioxide in an exemplary embodiment. However, other electrical insulators may be utilized in alternate embodiments.

The integrated circuit 10 includes a transistor 24, where the transistor 24 includes a source 26, a drain 28, a gate 30, a gate insulator 31 underlying the gate 30, and a channel 32 defined underlying the gate insulator 31 and between the source 26 and the drain 28. As such, the gate insulator 31 is between the gate 30 and the channel 32. In the illustrated embodiment, the transistor 24 is a planar transistor where the source 26 and drain 28 are formed in the active layer 18, but finned transistors or other types of transistors may be utilized in place of, or with, planar transistors in various embodiments. In the illustrated embodiment, the source 26 and drain 28 include monocrystalline silicon implanted with conductivity determining impurities (dopants). The conductivity determining impurities may be "N" type or "P" type in alternate embodiments, and both types are used in many embodiments. "P" type conductivity determining impurities primarily include boron, aluminum, gallium, and indium, but other materials could also be used. "N" type conductivity determining impurities primarily include phosphorous, arsenic, and/or antimony, but other materials could also be used. The gate 30 is an electrical conductor, such as polysilicon with conductivity determining impurities at a sufficient concentration to make the gate 30 electrically conductive, and the gate insulator 31 is an electrical insulator, such as silicon dioxide or other electrically insulating materials. The channel 32 includes monocrystalline silicone in the illustrated embodiment. The source 26 and drain 28 extend from the substrate surface 20 to the buried insulator layer 16 in the illustrated embodiment, where the transistor 24 is fully depleted and the source 26 and drain 28 physically contact the buried insulator layer 16. However, in alternate embodiments the source 26 and drain 28 extend into the active layer 18 but stop before reaching the buried insulator layer 16. Other types of transistors 24 are utilized in various embodiments.

In the illustrated embodiment, the semiconductive material of the active layer 18 has been replaced with various components, such as the shallow trench isolation structure 22, the source 26, and the drain 28. However, other portions of the integrated circuit 10 may include the semiconductive material originally provided as the active layer 18 of the substrate 12. In any event, the layer directly overlying the buried insulator layer 16 is referred to as the active layer 18, even in embodiments where the semiconductive material originally present in the active layer 18 has been replaced with insulating materials, electrically conductive materials, and/or other semiconductive materials.

One or more interlayer dielectric layers 34 are formed overlying the substrate 12, where the interlayer dielectric layers 34 are electrical insulators. In an exemplary embodiment, the interlayer dielectric layers 34 include a base interlayer dielectric 36 and a stop interlayer dielectric 38, but in other embodiments the interlayer dielectric layers 34 include more or fewer layers and the number of layers may vary within a single integrated circuit 10. The interlayer dielectric layer(s) 34 include a wide variety of electrically insulating materials in various embodiments. For example, un-doped silicate glass (USG), silicon nitride, silicon oxynitride, silicon dioxide, low K dielectric materials, or combinations thereof may be used. The stop interlayer dielectric 38 is a different material than that of the base interlayer dielectric 36 to facilitate selective etching in embodiments where the stop interlayer dielectric 38 is present. For example, silicon nitride in the stop interlayer dielectric 38 may be utilized with silicon dioxide in the base interlayer dielectric 36 for etching purposes. In a specific, non-limiting embodiment, the stop interlayer dielectric 38 may be formed of a silicon carbide-based passivation material layer including nitrogen. In one example, silicon carbide with nitrogen deposited using chemical vapor deposition (CVD) from a trimethylsilane source, which is commercially available from Applied Materials under the tradename of NBLOK, is used as the stop interlayer dielectric 38. The compound with less nitrogen (N) (less than about 5 mol %), i.e., $Si_aC_bN_cH_d$, is referred to as "BLOK", and the compound with more N (about 10 mol % to about 25 mol %), i.e., $Si_wC_xN_yH_z$, is referred to as "NBLOK".

A wide variety of interconnects 40 are formed in the various interlayer dielectric layers 34, where the interconnects 40 are electrical conductors such as copper, aluminum, titanium, or other electrically conductive materials. Via contacts 42 are formed through various interlayer dielectric layers 34, where the via contacts 42 are electric conductors that may be the same or different materials than that of the interconnects 40. The interconnects 40 and the via contacts 42 are routed to provide desired electrical communication between various electronic components, such as the illustrated transistor 24. The term "electrical communication," as used herein, means electrical current is capable of flowing from one component to another, where the electrical current may or may not flow through an electrically conductive or semiconductive intervening component. The term "direct electrical contact," as used herein, means direct physical contact between components that are electrically conductive or semiconductors, but not electrical insulators. In one embodiment, the via contacts 42 in a first level directly overlying the substrate 12 include tungsten, the via contacts 42 and the interconnects 40 in overlying layers include copper and are formed by a dual damascene process such that the interconnect 40 and the underlying via contact 42 are a continuous material, but other materials and configurations are possible in alternate embodiments.

A wide variety of electronic components are optionally utilized in various embodiments, such as memory cells (described more fully below), capacitors, resistors, inductors, sensors, etc. One of the via contacts 42 is formed in electrical communication with the source 26 and with a source line 48, where the source line 48 is an interconnect that is in electrical communication with the source 26. The source line 48 is utilized in reading and/or writing to a memory cell (described below.)

A capping conductor 44 is formed overlying the one or more interlayer dielectric layers 34, the interconnects 40, and the via contacts 42 in the illustrated embodiment, but other embodiments are also possible. The capping conductor 44 is an electrical conductor, such as aluminum, copper, titanium, or other materials, and a capping insulator 46 may overlie the capping conductor 44. The capping insulator 46 is an electrical insulator, such as silicon dioxide or a wide variety of other materials. In an exemplary embodiment, a via contact 42 extends from the capping conductor 44 and makes an electrical connection with an underlying component, such as an interconnect 40. The capping conductor 44 and the via contact 42 that extends therefrom include aluminum in an exemplary embodiment, but other materials and configurations are also possible. The illustrated portion of an integrated circuit 10 is merely exemplary, and many different configurations and components may be included or excluded in various embodiments. In the embodiment illustrated in FIG. 1, the integrated circuit 10 is free of a memory cell at the illustrated stage of production, so the interlayer dielectrics may be formed with annealing, deposition, or other processes with a thermal budget that exceeds the thermal budget of the yet-to-be formed memory cells. The ability to produce the one or more interlayer dielectric layers 34 with the associated interconnects 40 and via contacts 42 up to and including the optional capping conductor 44 and/or capping insulator 46 allows for increased design options because the thermal budget is not constrained by the memory cell thermal budget at the stage of production illustrated in FIG. 1.

Figure 2:
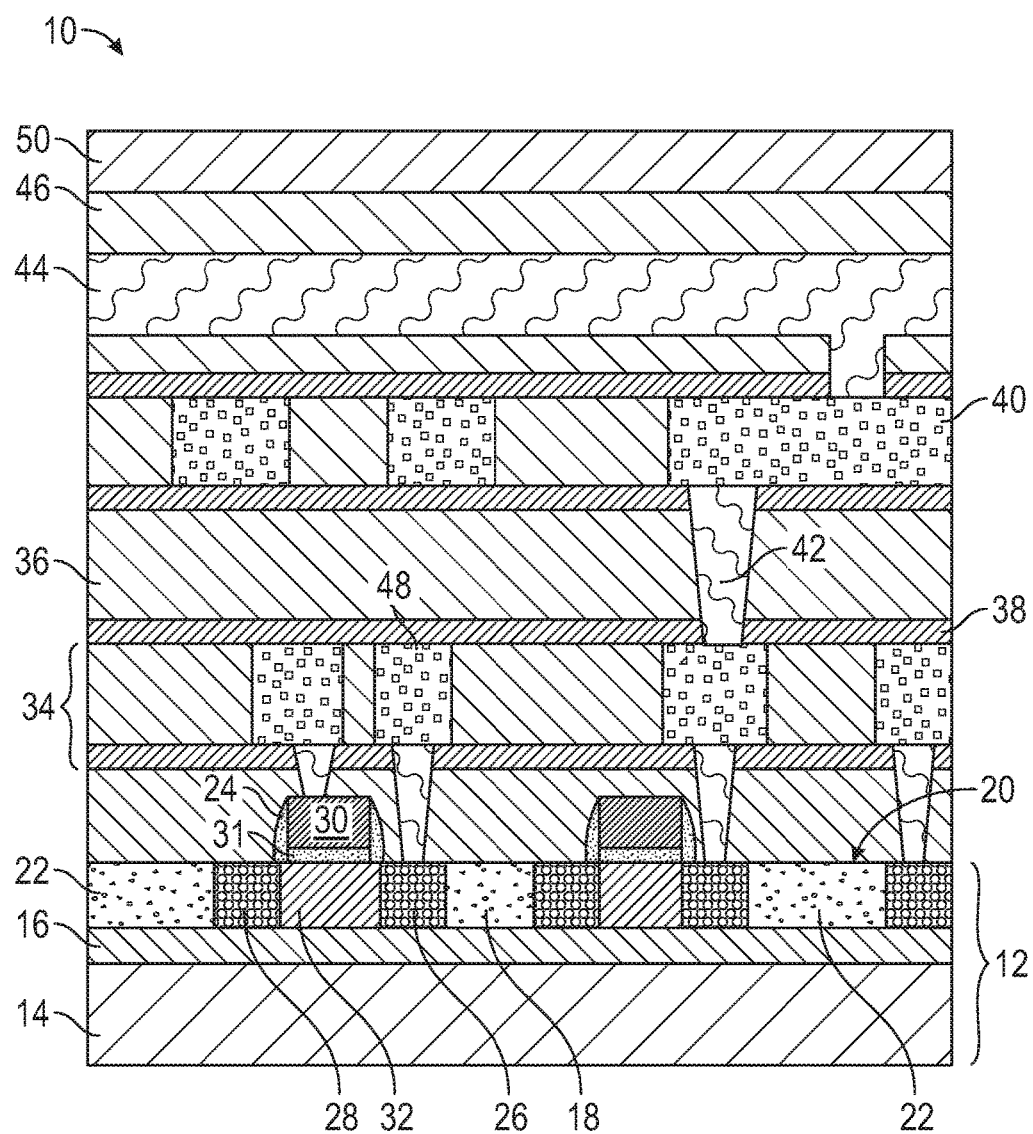

Referring to an exemplary embodiment illustrated in FIG. 2, a carrier wafer 50 is attached to the capping insulator 46, such as with an adhesive. The integrated circuit 10 is flipped upside down at this stage of manufacture, so FIGS. 2-8 could be illustrated upside down where new components and layers would be formed and illustrated at the top instead of the bottom of the FIGS., but the FIGS. are consistently illustrated with the substrate 12 at or near the bottom for clarity. The reader is advised that the carrier wafer 50 is typically illustrated at the bottom of the integrated circuit 10, but to prevent a change in the description about one component over or underlying another, the illustrated portion of the integrated circuit 10 shows the carrier wafer 50 at the top. Therefore, despite the orientation of the integrated circuit 10 during the various manufacturing stages, the substrate 12 is consistently shown at or near the bottom and all the FIGS. are illustrated in the same orientation. The reader is also advised that new layers or components are typically formed and illustrated at the top of the integrated circuit 10, but FIGS. 2-8 illustrate the manufacturing process adding new features at the bottom. The illustrated embodiment includes a capping insulator 46 as a top surface of the integrated circuit 10 at the present stage of manufacture, but in alternate embodiments the carrier wafer 50 is attached to other components that form the top surface of the integrated circuit 10 at the present stage of manufacture. The carrier wafer 50 is monocrystalline silicon in an exemplary embodiment, but a wide variety of other materials are utilized in alternate embodiments. The carrier wafer 50 may be removed at a later stage, as described below, so the choice of material is not critical. In other embodiments, the carrier wafer 50 is formed on the capping insulator 46 (or other top surface of the integrated circuit 10) instead of being attached.

Figure 3:
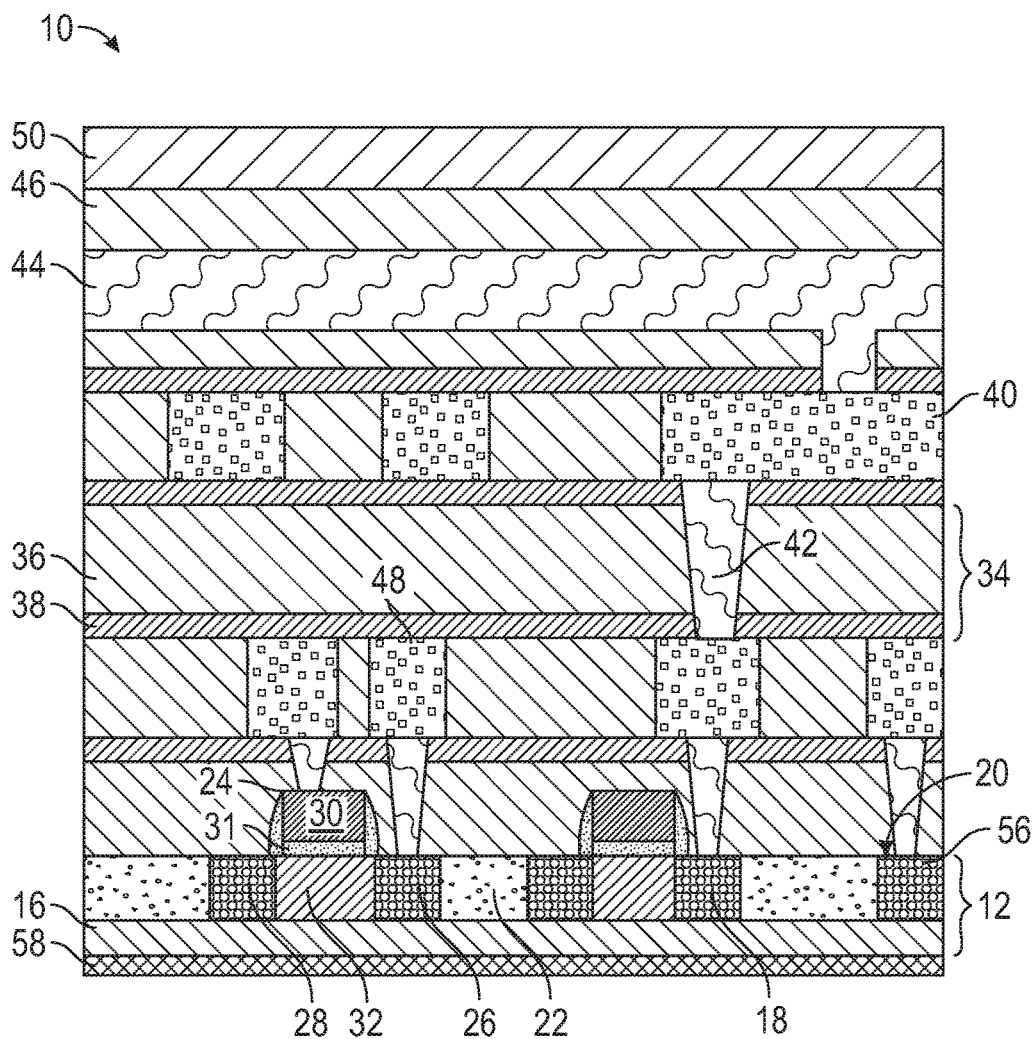

FIG. 3 illustrates an embodiment where the handle layer 14 of the substrate 12 is removed, with continuing reference to FIG. 2. An initial portion of the handle layer 14 is removed with a grinding operation followed by complete removal with a selective chemical mechanical planarization in an exemplary embodiment, but other removal techniques are utilized in alternate embodiments. Selective chemical mechanical planarization may use a slurry selective to the material of the handle layer 14, such that the buried insulator layer 16 is exposed on a bottom surface of the integrated circuit 10 at the stage of manufacture illustrated in FIG. 3. A first bottom stop layer 58 is then formed underlying the buried insulator layer. The first bottom stop layer 58 is silicon nitride in an exemplary embodiment, but the first bottom stop layer 58 includes other materials in alternate embodiments. The first bottom stop layer 58 may be formed by low pressure chemical vapor deposition using ammonia and dichlorosilane, but other formation techniques or materials are utilized in alternate embodiments A first drain via contact 52 is formed through the first bottom stop layer 58 and the buried insulator layer 16 such that the first drain via contact 52 is in electrical communication with the drain 28 of the transistor 24, as illustrated in an exemplary embodiment in FIG. 4. One or more first bit line via contacts 54 are formed through the first bottom stop layer 58 and the buried insulator layer 16 in other locations. In an exemplary embodiment, one or more vias are positioned lithographically and formed with an etch selective to the material of the first bottom stop layer 58 first, followed by an etch selective to the materials of the buried insulator layer 16. The open via is then filled, such as by deposition of a conductive material within the via to form the via contact 42 (including the first drain via contact 52 and the first bit line via contact 54, which are examples of the via contacts described above). Overburden is then removed, such as with chemical mechanical planarization. The first drain via contact 52 and the first bit line via contact 54 are also electrical conductors, as described for the other via contacts 42 above. In the illustrated embodiment, the first bit line via contact 52 is in electrical communication with an active doped region 56, where the active doped region 56 is a portion of the active layer 18 that includes conductivity determining impurities at a concentration similar to that of the source 26 and/or drain 28. In alternate embodiments, the active doped region 56 is an electrically conductive area within the active layer 18 that may be formed in a variety of manners. A first bottom dielectric layer 60 is formed underlying the buried insulator layer 16 and the first drain and first bit line via contacts 52, 54. The first bottom dielectric layer 60 is an electrical insulator, such as silicon dioxide or a wide variety of other materials.

Figure 4:
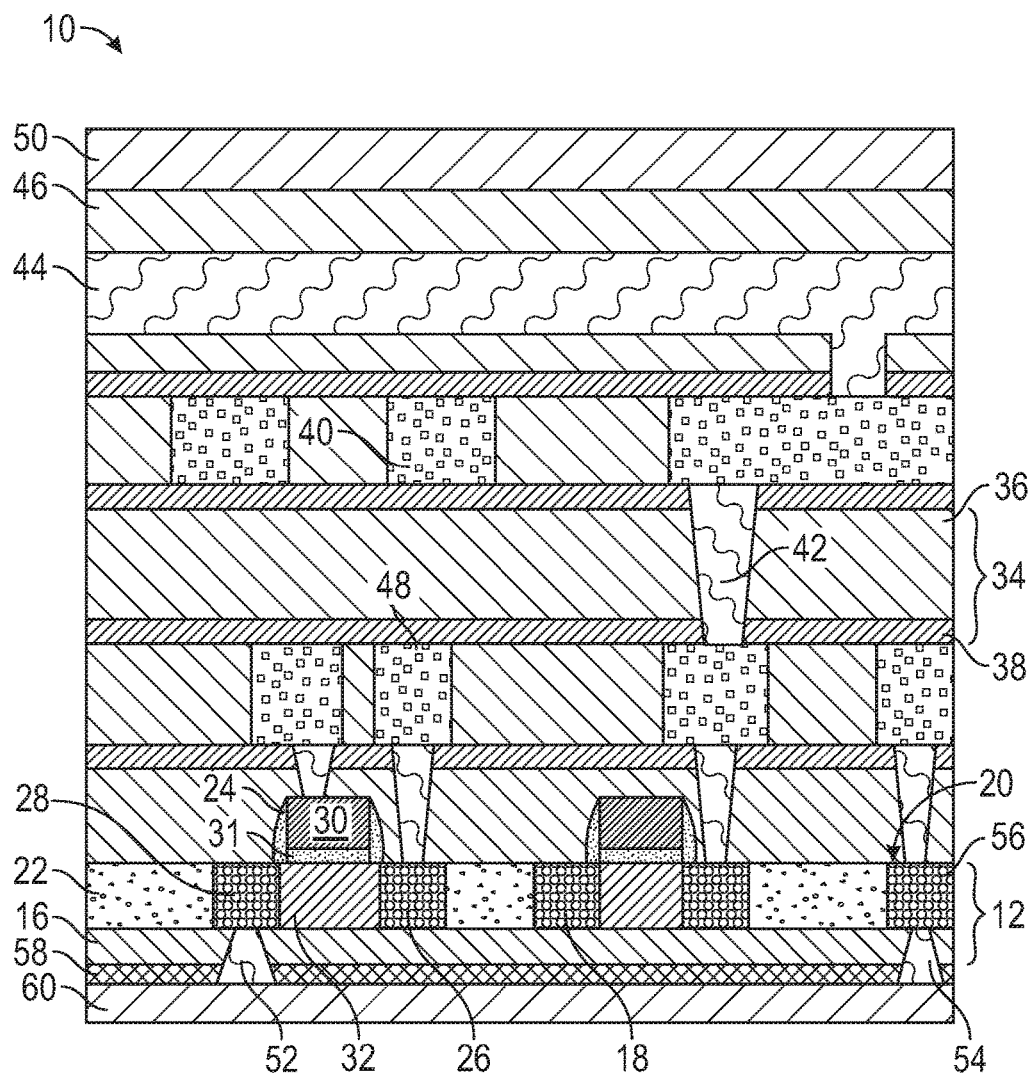
Figure 5:
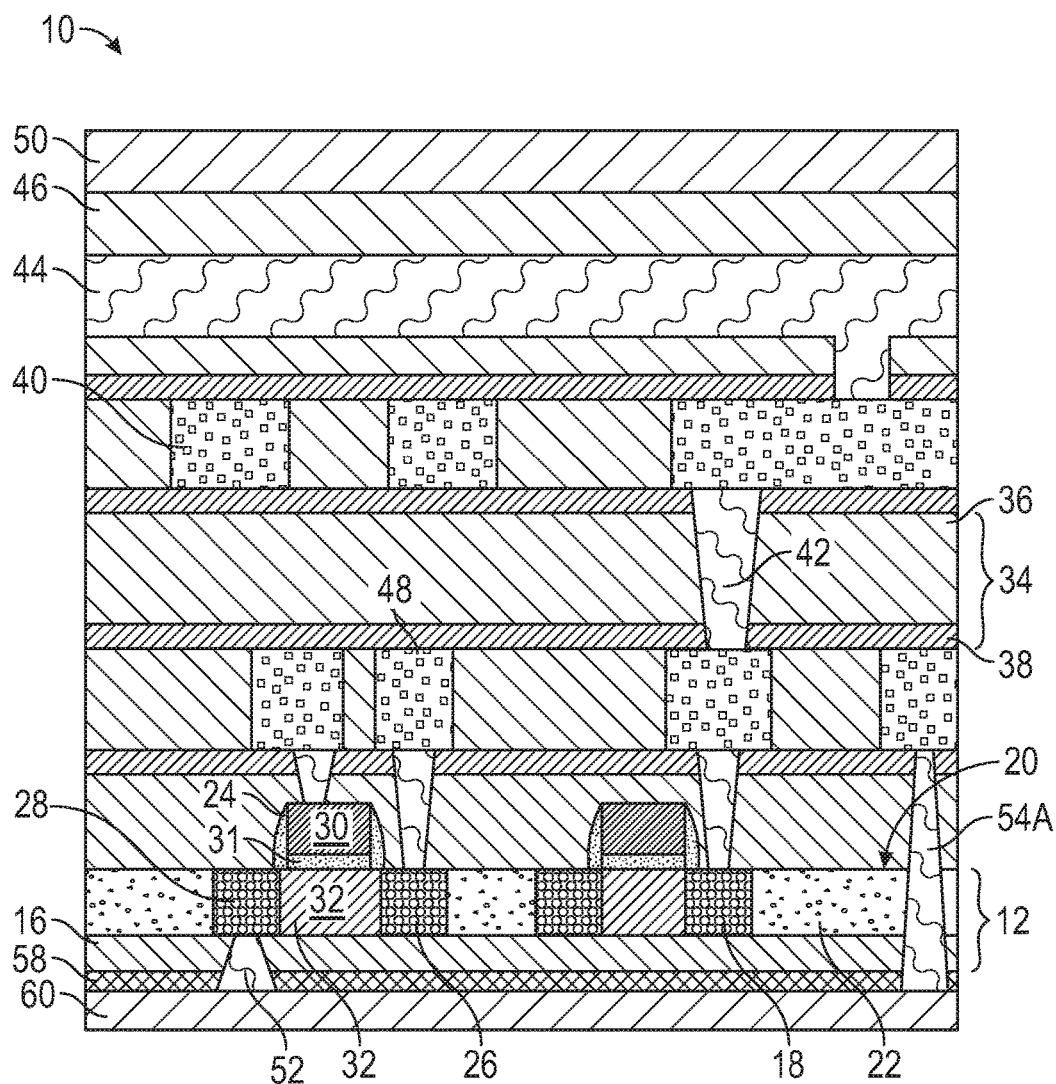

An alternate embodiment is illustrated in FIG. 5, with continuing reference to FIG. 4. The embodiment in FIG. 5 illustrates where the first bit line via contact 54A extends through the first bottom stop layer 58, the buried insulator layer 16, the active layer 18, and one or more of the interlayer dielectric layers 34. The first bit line via contact 54A is in electrical communication with an interconnect 40. The first bit line contact 54, 54A in both of FIGS. 4 and 5 is in electrical communication with the same interconnect 40, but the embodiment in FIG. 4 includes more components. The embodiment in FIG. 5 may include an additional mask, etch, and via formation for the first bit line via contact 54A that is separate from the techniques used to form the first drain via contact 52, so the manufacturing process is more complex. However, the electrical resistance of the first bit line via contact 54A in FIG. 5 may be less than that of the first bit line via contact 54, the active doped region 56, and additional via contacts 42 as illustrated in FIG. 4.

Figure 6:
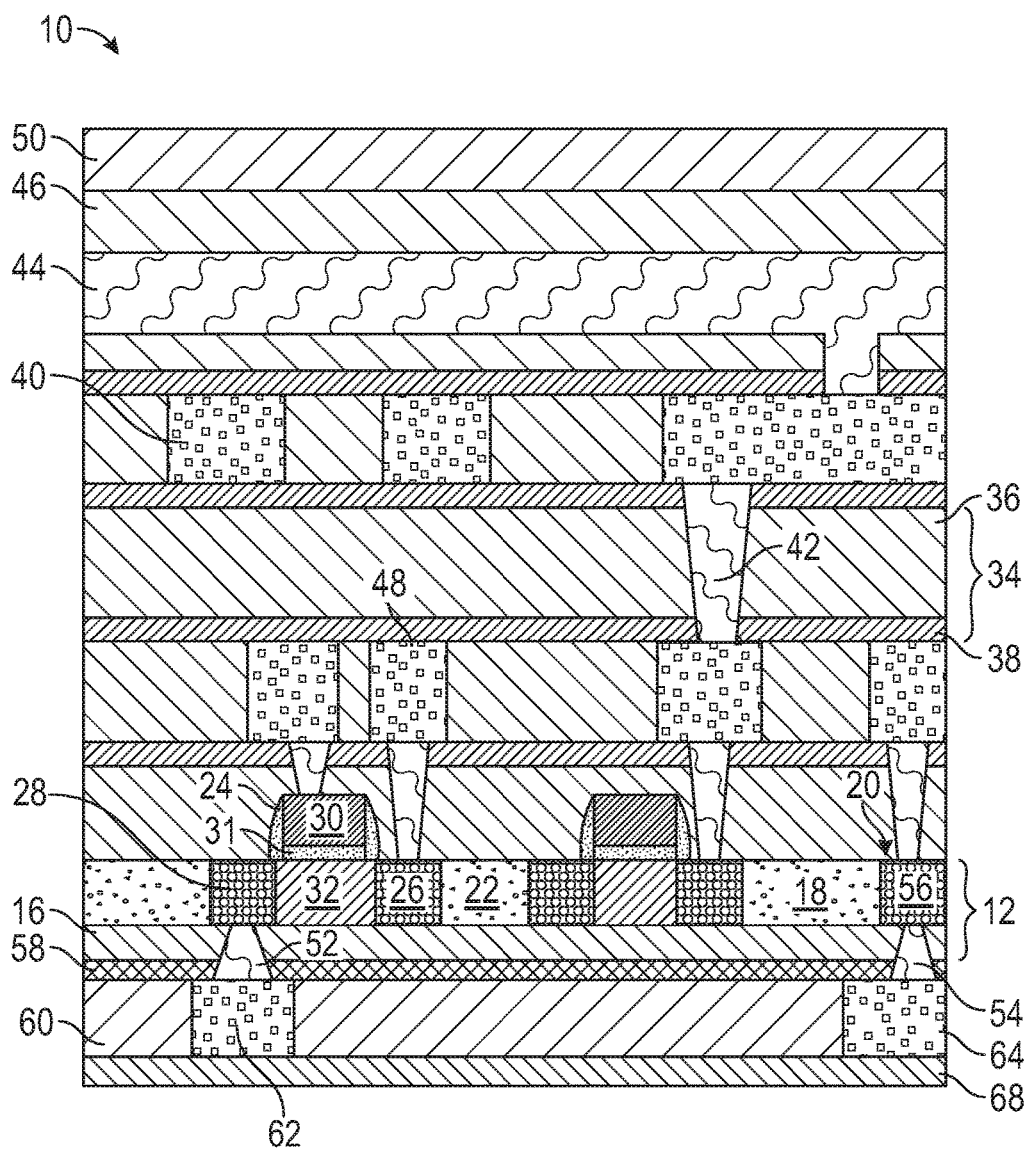

Referring to an embodiment in FIG. 6, a drain contact 62 and a bit line contact 64 are formed in the first bottom dielectric layer 60, and a second bottom stop layer 68 is formed underlying the first bottom dielectric layer 60 and the drain and bit line contacts 62, 64. The drain and bit line contacts 62, 64 are electrically conductive materials. In one embodiment, the drain and bit line contacts 62, 64 are formed by lithographically exposing desired sections of the first bottom dielectric layer 60, then etching an opening, then depositing a conductive material within the opening, and then removing overburden, such as with chemical mechanical planarization. Other embodiments are also possible. The second bottom stop layer 68 is an electrical insulator, such as silicon nitride, and may be formed by low pressure chemical vapor deposition using ammonia and dichlorosilane, but other formation techniques or materials are utilized in alternate embodiments.

Figure 7:
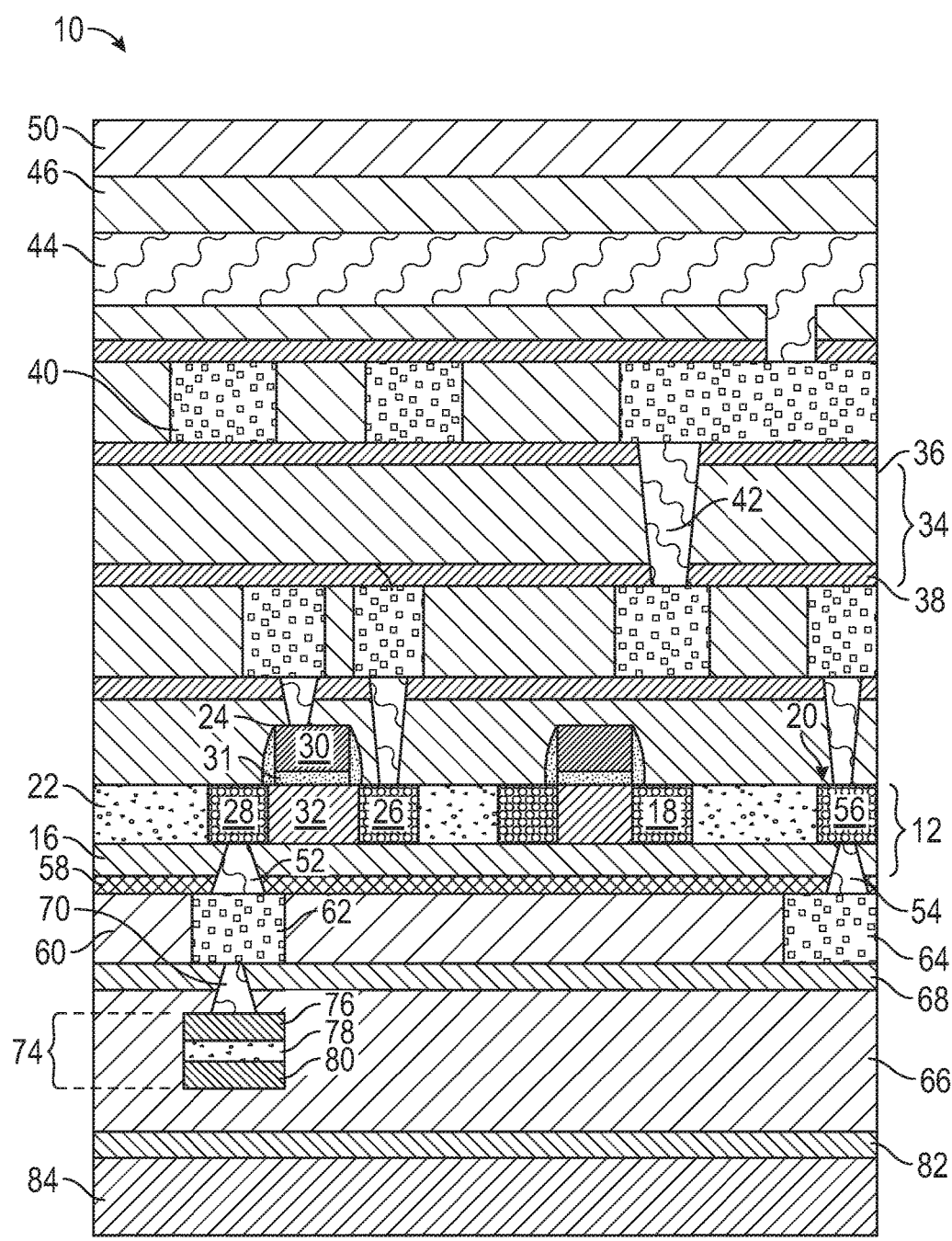

A second drain via contact 70 is formed underlying the drain contact 62 in an embodiment illustrated in FIG. 7. The second drain via contact 70 is an electrical conductor, and may be formed in a similar manner to that described for the first drain and bit line via contacts 52, 54. A memory cell 74 is formed in a second bottom dielectric layer 66, where the memory cell 74 is in electrical communication with the drain 28 through the first and second drain via contacts 52, 70 and the drain contact 62. In one embodiment, the memory cell 74 is a magnetic tunnel junction (MTJ) memory cell, but other types of memory cells 74 are utilized in alternate embodiments. The MTJ memory cell includes an MTJ stack with at least two magnetic layers separated by a non-magnetic barrier, where a fixed layer has a set magnetic property and a free layer has a programmable magnetic property for storing information. If the fixed layer and the free layer have parallel magnetic poles, the resistance through the MTJ stack is measurably less than if the fixed layer and the free layer have anti-parallel poles, so parallel magnetic poles may be read as a "0" and anti-parallel poles may be read as a "1." The MTJ stack is typically incorporated into the memory cell 74, and many memory cells 74 with MTJ stacks art incorporated into a memory bank. Each layer of the MTJ stack may include sub-layers in various embodiments.

In an exemplary embodiment, a thin portion of the second bottom dielectric layer 66 is formed, and then the second drain via contact 70 is formed. After formation of the second drain via contact 70, the magnetic and insulating layers are deposited for the memory cell 74. The MTJ stack includes a plurality of individual material layers. In one embodiment, the MTJ stack includes a free layer 76 underlying the drain contact 62, a tunnel barrier layer 78 underlying the free layer 76, and a pinning layer 80 underlying the tunnel barrier layer 78. Each of the free layer 76, the tunnel barrier layer 78, and/or the pinning layer 80 may include sublayers (not individually illustrated) in various embodiments. Although not illustrated, the free layer 76 and the pinning layer 80 are reversed in alternate embodiments, where the free layer 76 underlies the tunnel barrier layer 78 and the pinning layer 80 overlies the tunnel barrier layer 78, but the tunnel barrier layer 78 is always positioned between the free and pinning layers 76, 80. In some embodiments the tunnel barrier layer 78 is thin, such as from about 1 to about 2 nm in thickness, and is an electrical insulator. The tunnel barrier layer 78 includes magnesium oxide in an exemplary embodiment, but the tunnel barrier layer 78 may include amorphous aluminum oxide or other electrical insulating materials in alternate embodiments. The tunnel barrier layer 78 may be deposited by sputtering magnesium followed by plasma oxidation, but other deposition techniques are also possible.

The free layer 76 includes cobalt iron boron (CoFeB) and the pinning layer 80 includes platinum manganese (PtMn) in one embodiment. However, in other embodiments the free layer 76 and/or the pinning layer 80 include other materials such as iridium manganese (IrMn), nickel manganese (NiMn), iron manganese (FeMn), CoFeB, or other materials. The free and pinning layers 76, 80 may be formed by ion beam sputtering, but other techniques can be used in alternate embodiments. The pinning layer 80 and the free layer 76 include magnetic materials and are magnetic, and the tunnel barrier layer 78 is non-magnetic. As used herein, a layer or material is "magnetic" if it is a ferromagnetic material, where the term "ferromagnetic" does not require the presence of iron. More particularly, a material is "magnetic" if it is a permanent magnet that retains its magnetic field after an induction magnetic field is removed, where the permanent magnet has a residual flux density of about 0.1 tesla or more. A layer or material is "non-magnetic" if it is a diamagnetic or a paramagnetic material, and more particularly does not form a permanent magnet or is only capable of maintaining a residual flux density of less than about 0.1 tesla or less. A "permanent" magnet is a magnet that has residual flux density of about 0.1 tesla or more for at least about 1 week or more after being removed from an induction magnetic field.

The pinning layer 80 is typically a fixed magnet, and the magnetic orientation of the free layer 76 is changed relative to the magnetic orientation of the pinning layer 80 to change the resistance of the memory cell 74. The change in resistance of the memory cell 74 serves as memory for the integrated circuit 10. The free layer 76 is in electrical communication with the drain 28 in the illustrated embodiment. The memory cell 74 is formed by lithographically isolating desired areas and removing the deposited layers except where the memory cell(s) 74 are formed. The remainder of the second bottom dielectric layer 66 is then formed around and over the memory cell 74. A third bottom stop layer 82 is formed underlying the second bottom dielectric layer 66 in a similar manner to the formation of the second bottom stop layer 68. A third bottom dielectric layer 84 is then formed underlying the third bottom stop layer 82. The third bottom stop layer 82 and the third bottom dielectric layer 84 are electrical insulators, and may be formed of different materials for selective etching operations.

Figure 8:
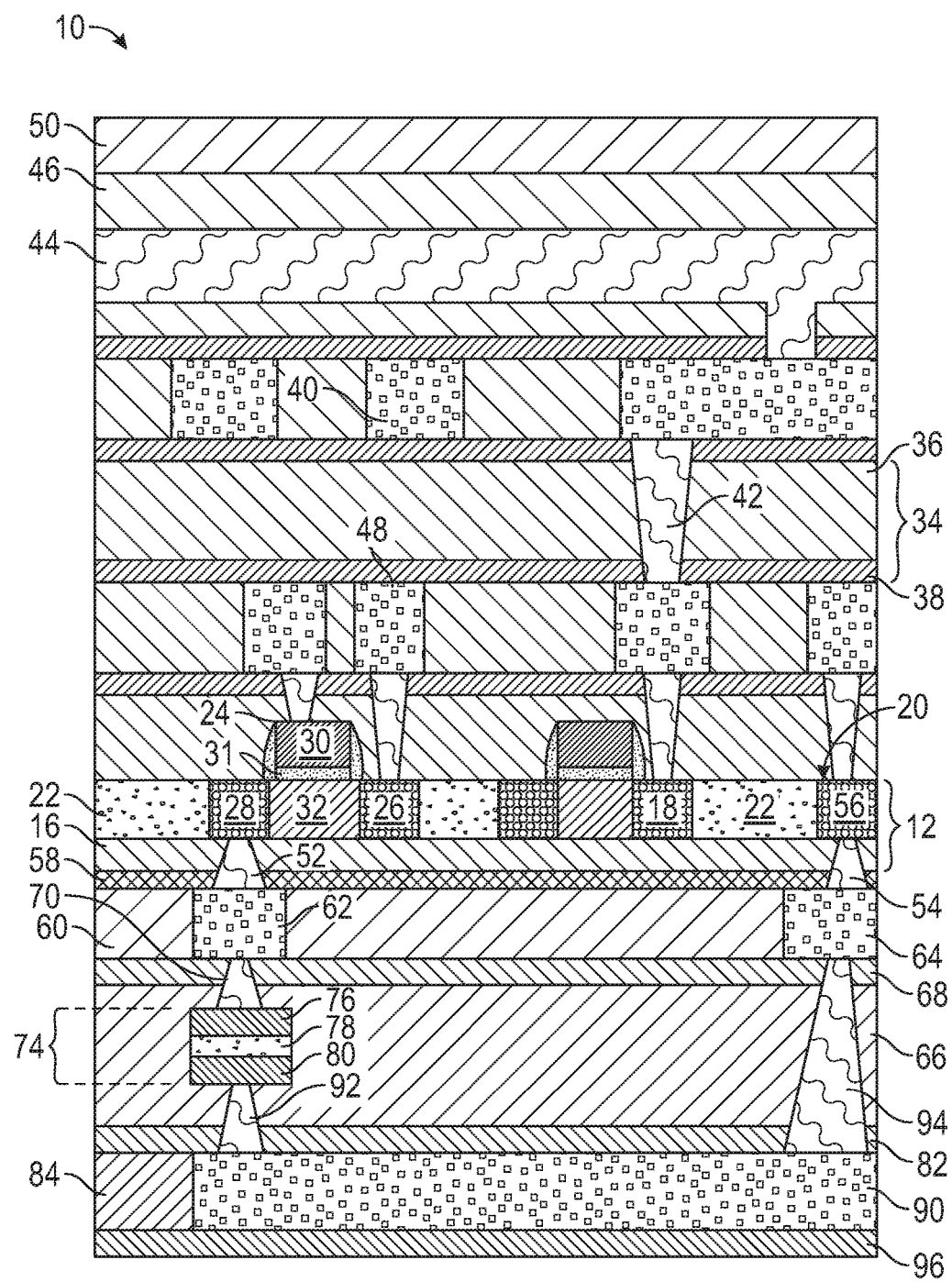

Referring to FIG. 8, A third drain via contact 92 and a second bit line via contact 94 are formed in and through the second bottom dielectric layer 66 using appropriate techniques, such as described above. A bit line 90 is formed in the third bottom dielectric layer 84, where the bit line 90 is an electrical conductor. The bit line 90 and the memory cell 74 are in electrical communication through the third drain via contact 92, and the bit line 90 is in electrical communication with components overlying the buried insulator layer 16 through the second bit line via contact 94. The bit line 90 may be formed by a dual damascene process, but other techniques are utilized in alternate embodiments. The bit line 90 and the memory cell 74 underlie the buried insulator layer 16, and the transistor 24 and the source line 48 overlie the buried insulator layer 16, so the bit line 90 and the memory cell 74 are on opposite sides of the buried insulator layer 16 relative to the transistor 24 and the source line 48. The illustrated transistor 24 where the drain 28 is in electrical communication with the memory cell 74 and the source 26 is in electrical communication with the source line 48 is a memory cell control transistor, where a "memory cell control transistor" is a transistor that is utilized in programming and/or reading the memory cell 74. In a typical embodiment, the bit line 90 and the source line 48 are also utilized for programming and/or reading the memory cell 74, where a plurality of bit lines 90, source lines 48, memory cells 74, memory cell control transistors 24, and other components are part of a memory bank within the integrated circuit 10. In an exemplary embodiment, the bit line 90 is formed after the memory cell 74, so the memory cell 74 overlies the bit line 90 and the memory cell 74 is between the bit line 90 and the buried insulator layer 16. A fourth bottom stop layer 96 is formed underlying the bit line 90 in an exemplary embodiment.

The substrate 12 is flipped to remove the handle layer 14 (illustrated in FIG. 2), so components such as the memory cell 74 that are formed underlying the buried insulator layer 16 are "upside down" from the typical arrangement, relative to those components formed overlying the buried insulator layer 16, such as the transistor 30. The transistor 30 overlying the buried insulator layer 16 includes a gate insulator 31 underlying the gate 30, and the memory cell 74 is formed underlying the buried insulator layer 16. As such, the gate insulator 31 is closer to the memory cell 74 than the gate 30, which is the reverse of integrated circuits with memory cells that are formed overlying the buried insulator layer 16. In the same manner, the gate insulator 31 is closer to the bit line 90 than the gate 30, again because the bit line 90 underlies the substrate 12 and the gate insulator 31 underlies the gate 30. The fact that the gate insulator 31 is closer to the memory cell 74 and the bit line 90 than the gate 30 is a result of flipping the substrate 12 to form the memory cell 74 underlying the buried insulator layer 16.

Figure 9:
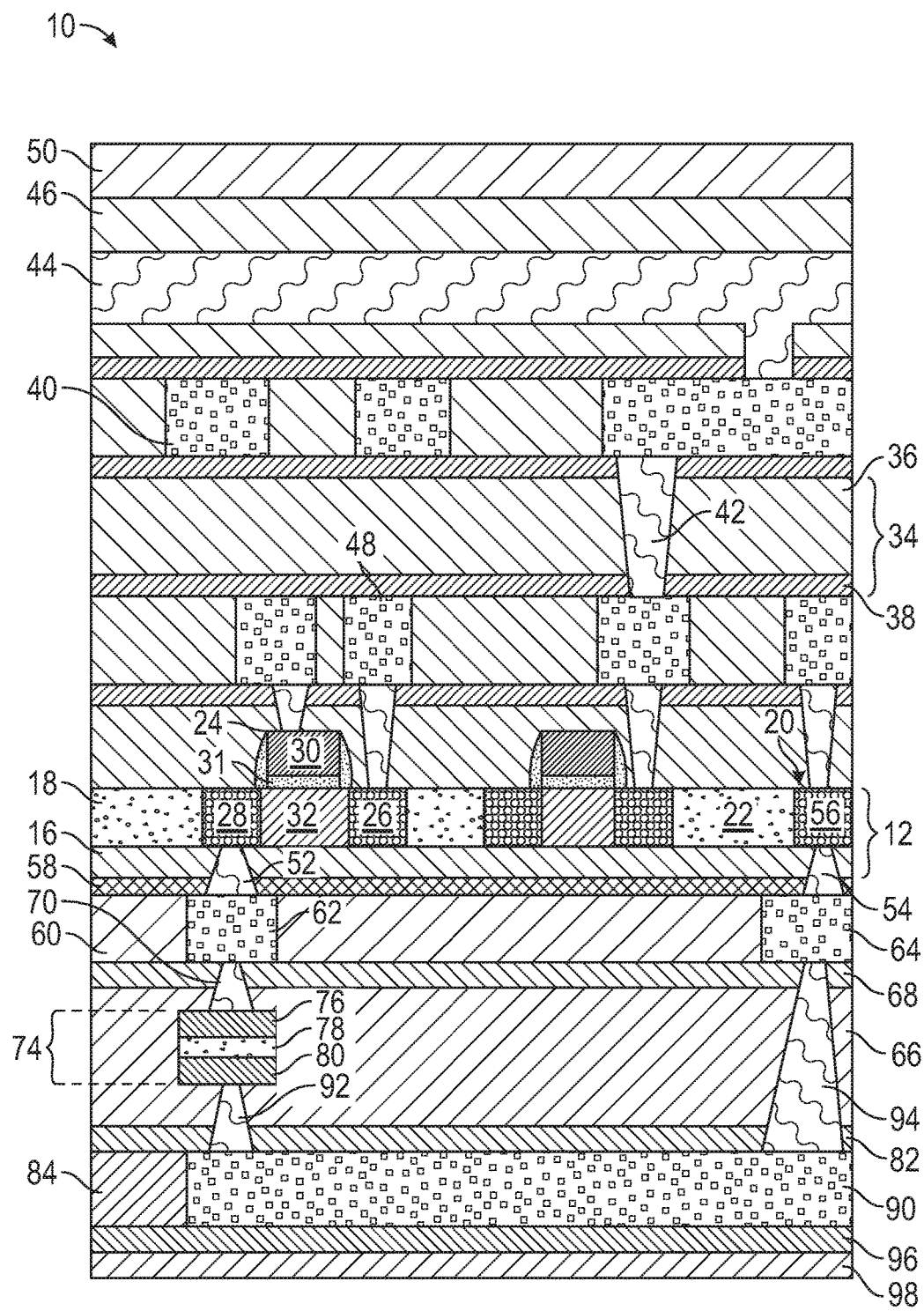

Dicing tape 98 is attached to the fourth bottom stop layer 96 (of any other layer that is the bottom layer of the integrated circuit 10 in alternate embodiments) and the carrier wafer 50 is removed from the integrated circuit 10, as illustrated in an exemplary embodiment in FIG. 9 with continuing reference to FIG. 8. Dicing tape 98 may be attached with an adhesive, and the carrier wafer 50 may be removed with heat or a wide variety of other techniques. The integrated circuit 10 includes the memory cell 74 and the bit line 90 on the opposite side of the buried insulator layer 16 as the transistor 24 and most of the other electronic components. Removing the memory cell 74 and the bit line 90 from over the buried insulator layer 16 frees up the space that would otherwise be occupied by the memory cell 74 and the bit line 90 overlying the buried insulator layer 16. This extra space produced overlying the buried insulator layer 16 allows for relaxation of the production rules for the interconnects 40, via contacts 42, and other electronic components overlying the buried insulator layer 16, or it allows for inclusion of additional electronic components overlying the buried insulator layer 16 for increased capabilities, or both.

Forming an MTJ memory cell 74 and associated bit line 90 underlying the buried insulator layer 16 has been described above, but it will be appreciated that other types of memory cells 74 and/or other structural layouts than as described above could be utilized in a similar manner to free space overlying the buried insulator layer 16.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. An integrated circuit comprising:
   a substrate comprising a buried insulator layer and an active layer overlying the buried insulator layer;
   a transistor overlying the buried insulator layer;
   a memory cell underlying the buried insulator layer such that the memory cell and the transistor are on opposite sides of the buried insulator layer;
   a first bottom dielectric layer underlying the buried insulator layer;
   a second bottom dielectric layer underlying the first bottom dielectric layer;
   a source line overlying the buried insulator layer; and
   a bit line underlying the buried insulator layer, such that the source line and the bit line are on opposite sides of the buried insulator layer.

2. The integrated circuit of claim 1 wherein:
   the active layer comprises monocrystalline silicon and the buried insulator layer comprises silicon dioxide.

3. The integrated circuit of claim 1 wherein:
   the memory cell comprises a magnetic tunnel junction memory cell.

4. The integrated circuit of claim 1 further comprising:
   a first bit line via contact extending through the buried insulator layer, wherein the first bit line via contact is in electrical communication with the bit line.

5. The integrated circuit of claim 1 wherein:
   the transistor comprises a source, a drain, and a gate; the integrated circuit further comprising:
   a first drain via contact extending through the buried insulator layer, wherein the memory cell and the drain are in electrical communication through the first drain via contact.

6. The integrated circuit of claim 5 wherein:
   the source line is in electrical communication with the source.

7. The integrated circuit of claim 5 wherein:
the source directly contacts the buried insulator layer.

8. The integrated circuit of claim 1 wherein:
the transistor comprises a gate and a gate insulator, wherein the gate overlies the gate insulator; and
wherein the gate insulator is closer to the memory cell than the gate.

9. The integrated circuit of claim 1 further comprising:
a first bottom stop layer underlying the buried insulator layer, wherein the first bottom dielectric layer underlies the first bottom stop layer; and
a second bottom stop layer positioned between the first bottom dielectric layer and the second bottom dielectric layer.

10. An integrated circuit comprising:
a substrate comprising a buried insulator layer and an active layer overlying the buried insulator layer;
a transistor overlying the buried insulator layer, wherein the transistor comprises a source and a drain;
a source line overlying the buried insulator layer, wherein the source line is in electrical communication with the source;
a bit line underlying the buried insulator layer such that the bit line and the source line are on opposite sides of the buried insulator layer; and
a memory cell, wherein the memory cell is in electrical communication with the bit line.

11. The integrated circuit of claim 10 wherein the drain is in electrical communication with the memory cell.

12. The integrated circuit of claim 11 wherein the memory cell underlies the buried insulator layer such that the transistor and the memory cell are on opposite sides of the buried insulator layer.

13. The integrated circuit of claim 10 wherein the drain directly contacts the buried insulator layer.

14. The integrated circuit of claim 10 wherein the memory cell is a magnetic tunnel junction memory cell.

15. The integrated circuit of claim 10 wherein:
the transistor further comprises a gate insulator and a gate, wherein the gate overlies the gate insulator; and wherein
the gate insulator is closer to the bit line than the gate.

16. The integrated circuit of claim 10 wherein the buried insulator layer comprises silicon dioxide.

17. The integrated circuit of claim 10 further comprising a first bit line via contact that extends through the buried insulator layer, wherein the first bit line via contact is in electrical communication with the bit line.

* * * * *